United States Patent [19]

Schroder

[11] 4,099,134
[45] Jul. 4, 1978

[54] AMPLIFIER WITH CONTROLLABLE TRANSMISSION FACTOR AND SWITCHABLE CONTROL CHARACTERISTIC

[75] Inventor: Ernst Schröder, Hannover, Fed. Rep. of Germany

[73] Assignee: Licentia Patent-Verwaltungs-G.m.b.H., Frankfurt am Main, Fed. Rep. of Germany

[21] Appl. No.: 808,628

[22] Filed: Jun. 21, 1977

[30] Foreign Application Priority Data

Jul. 2, 1976 [DE] Fed. Rep. of Germany ....... 2629701

[51] Int. Cl.² .............................................. H03F 1/34
[52] U.S. Cl. ....................................... 330/51; 330/86; 330/108; 330/109; 330/110; 330/282; 330/294
[58] Field of Search ................. 330/51, 108, 107, 109, 330/86, 110, 282, 294

[56] References Cited

U.S. PATENT DOCUMENTS 3,815,039  6/1974  Fujisawa ............................. 330/86 X

*Primary Examiner*—James B. Mullins
*Attorney, Agent, or Firm*—Spencer & Kaye

[57] ABSTRACT

An amplifier whose transmission factor is to be controlled as a function of a control voltage and including an amplifier member having a negating input, connected to have its impedance varied by the control voltage and an electronically controllable variable impedance having one side connected to the amplifier member output, a second impedance connected between the other side of the first impedance and ground, and a switch assembly for switching the connections within the amplifier between two operating states providing mutually complementary control characteristics, the amplifier member output providing the amplifier output in one operating state and being connected to the negating input in the other operating state, and the point of connection between the impedances being connected to the negating input in the one operating state and providing the amplifier output in the other operating state.

4 Claims, 3 Drawing Figures

AMPLIFIER WITH CONTROLLABLE TRANSMISSION FACTOR AND SWITCHABLE CONTROL CHARACTERISTIC

BACKGROUND OF THE INVENTION

The present invention relates to an amplifier of the type which can have its transmission factor controlled by a control voltage and which can be switched between two operating states having respectively complementary control characteristics. The transmission factor of an amplifier is its gain or attenuation factor.

Such amplifiers are required, for example, to suppress noise in compander systems, and amplifiers of this type are disclosed in German Offenlegungsschrift [Laid-Open Application] No. 22 18 823 and German Auslegeschrift [Published Application] No. 24 06 258 and corresponding U.S. Pat. No. 3,969,680. In these systems an amplifier is required which has a certain control characteristic determining the relation between the output/input signal ratio and a control voltage during dynamic compression, and which has a complementary control characteristic relative to the above relation during dynamic expansion.

German Offenlegungsschrift [Laid-Open Application] No. 22 18 823 teaches that the gain of an amplifier which can be switched between two operating states can be varied by means of a controllable impedance which, in one operating state of the amplifier, is connected to a negative feedback path of the amplifier and, in the other operating state, is connected to the input of the amplifier.

Due to a drawback which primarily exists in simple compander systems, namely the modulation of the noise components in dependence on low frequency useful signals, there is known to exist the requirement, as disclosed in Funktechnik, 1973, pages 55–57, particularly in FIG. 6, to shift the lower limit frequency of the circuit effecting the dynamic compression or expansion, respectively, toward higher frequency values in dependence on the amplitude of the useful signals, the shifted characteristic being as parallel as possible to the original.

In the amplifier disclosed in German Offenlegungsschrift [Laid-Open Application] No. 22 18 823, the control voltage for the controllable impedance is derived from the useful signal, and a capacitance is connected in series with the controllable impedance so that the lower limit frequency of the amplifier is not highly dependent on the amplitude of the useful signals. However, the shift of the lower limit frequency obtained in this manner is limited to a small range. Moreover, in this known circuit, the amplitude of the amplifier output signal is also changed in an undesirable manner in the transmission band.

SUMMARY OF THE INVENTION

It is therefore an object of the present invention to construct an amplifier which can be switched in the above-described manner with respect to its control characteristic at low cost.

A further object of the invention is to enable the frequency characteristics to be accurately shifted in a parallel manner by the addition of frequency dependent components.

These and other objects are achieved, according to the present invention, by a novel circuit arrangement of an amplifier whose transmission factor is to be controlled in response to a control voltage and including a member for switching the amplifier between two operating states providing mutually complementary control characteristics, an amplifier member having an inverting input, and an electronically controllable first impedance connected to receive the control voltage and to present an impedance which varies as a function of the control voltage and which determines the amplifier transmission factor, the impedance being connected, in one of the operating states, in a negative feedback path of the amplifier by the switching means. According to the invention, the circuit arrangement further includes means connecting the first impedance to the output of the amplifier member, a second impedance connected to the first impedance to form therewith a series arrangement disposed between the output of the amplifier member and a point at the circuit reference potential of the amplifier; and means defining a direct current path connected to the output of the amplifier member, and the switching means are connected in the amplifier for, in the one operating state, connecting the inverting input of the amplifier member to the point of connection between the first and second impedances and connecting the output of the amplifier member as the output from the amplifier, and in the other operating state, connecting the direct current path in series between the amplifier member output and inverting input and connecting the point of connection between the first and second impedances as the output from the amplifier.

In order to achieve an accurate parallel shift of the frequency characteristics it is simply necessary to design the first impedance as a parallel arrangement of a controllable resistor and a capacitor and to design the second impedance as a capacitor. Various modifications and advantageous embodiments of the invention are described below.

DESCRIPTION OF THE PREFERRED EMBODIMENTS

Figure 1:
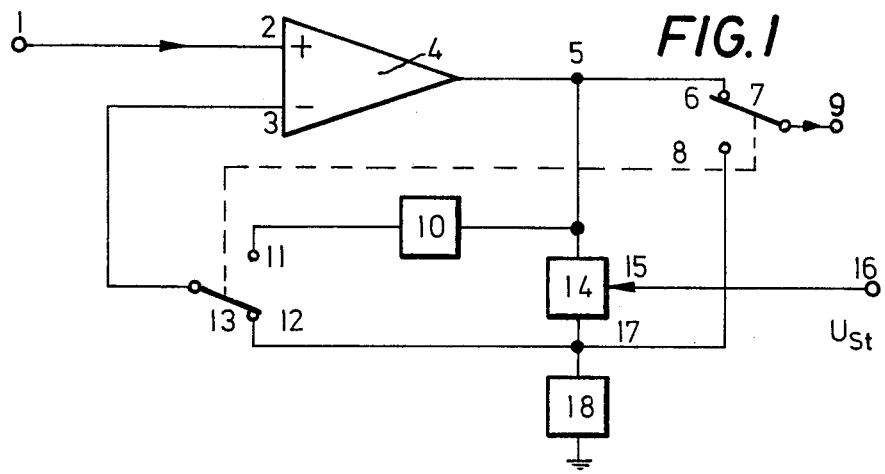
FIG. 1 is a basic circuit diagram of an amplifier according to a preferred embodiment of the invention.

FIG. 1 shows an amplifier circuit whose control characteristic, corresponding to the dependence of the amplifier gain on a control voltage $U_{St}$ at a terminal 16, can be switched between two states by means of two mutually coupled switches 7 and 13. Switches 7 and 13 can be constituted by a single double-pole, double-throw switch, or its electronic equivalent.

The signals to be processed present at input terminal 1, e.g. low frequency signals in a compander system, are fed to the noninverting input 2 of a differential amplifier 4 whose output 5, in the illustrated position of switch 7, is connected via contact 6, with output terminal 9 for the processed signals.

The output 5 of amplifier 4 is connected through a series connection of a first impedance 14 and a second impedance 18, to a point at the circuit reference potential, or ground. The first impedance 14 presents an electronically controllable impedance value, i.e. its impedance value can be varied by means of a control voltage applied to its control input 15. The connecting point 17 between the two above-mentioned impedances 14 and 18 is connected, via contact 12 of switch 13, with the inverting input 3 of amplifier 4. In this way, impedances 14 and 18 form a negative feedback path for amplifier 4 which can be controlled by means of the control voltage $U_{St}$, and the gain of amplifier 4 being variable corresponding to the impedance value of the above-described negative feedback path.

In the illustrated position of switches 7 and 13, an increase of the impedance value of impedance 14 results in an increase in the gain of amplifier 4. The complex gain $G_1$ of the described circuit can be expressed in a simplified manner by the following equation:

$$G_1 = \left|\frac{U_{output}}{U_{input}}\right| = \left|\frac{U_9}{U_1}\right| = \left|\frac{Z_{14} + Z_{18}}{Z_{18}}\right| \quad (1)$$

where $Z_{14}$ and $Z_{18}$ represent the impedance values of components 14 and 18.

If the described circuit is switched to its other possible operating state by actuation of the mutually coupled switches 7 and 13, then, due to the feedback then existing from output 5 via a d.c. path 10 and contact 11 to the inverting input 3 of amplifier 4, the amplifier has an effective gain of one or almost one. Thus the signal amplitude at output 5 of amplifier 4 is substantially the same as at the noninverting input 2. The circuit thus acts as if output 5 were electrically connected directly to input terminal 1. Therefore, the input signal at input terminal 1 effectively travels through impedance 14 and contact 8 to output terminal 9. In other words: if switches 7 and 13 are switched over to be connected to contacts 8 and 11, respectively, the described circuit acts like a voltage divider whose one partial impedance is formed by the controllable impedance 14 and whose other partial impedance is formed by impedance 18. Consequently, the following simplified equation results for the gain $G_2$ in this second operating state:

$$G_2 = \left|\frac{U_{output}}{U_{input}}\right| = \left|\frac{U_9}{U_1}\right| = \left|\frac{Z_{18}}{Z_{14} + Z_{18}}\right| \quad (2)$$

A comparison of the two equations (1) and (2) shows that the gain $G_2$ follows a curve which is complementary, since is is reciprocal, to gain $G_1$. The gain curves according to equations (1) and (2) have slopes with different signs.

Figure 2:
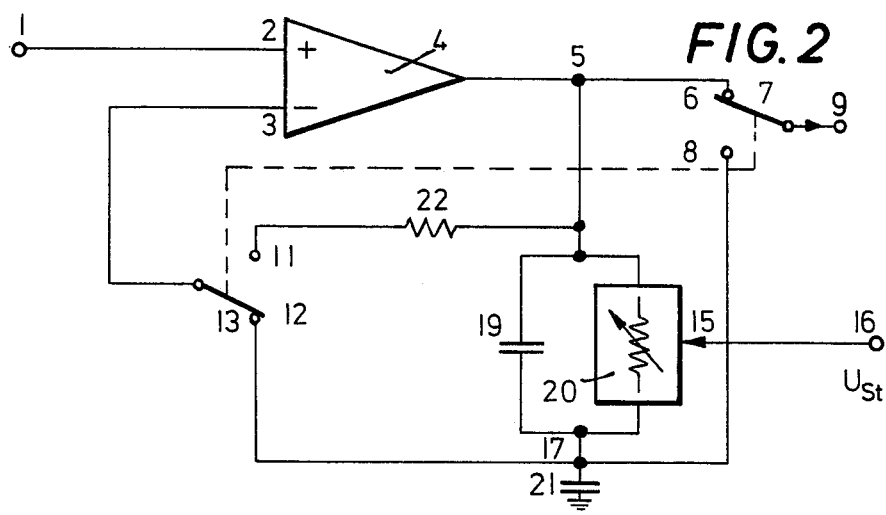
FIG. 2 is a circuit diagram of a specific form of construction for the amplifier according to FIG. 1.

FIG. 2 shows one advantageous circuit for the amplifier of FIG. 1, so constructed that the control voltage $U_{St}$ across terminal 16 can produce an accurate parallel shift of the frequency characteristic in addition to the required change in gain, G.

The circuit shown in FIG. 2 is a specific example of the basic circuit shown in FIG. 1 in that the d.c. path 10 is formed as an ohmic resistance 22 between output 5 and contact 11, and the impedance 18 is constituted by a capacitor 21. Moreover, impedance 14 is constituted in the circuit of FIG. 2 by the parallel arrangement of a capacitor 19 and an electronically controllable resistor 20, which preferably is a field effect transistor. The d.c. path containing resistor 22 may also be replaced by a d.c. short circuit.

Figure 3:
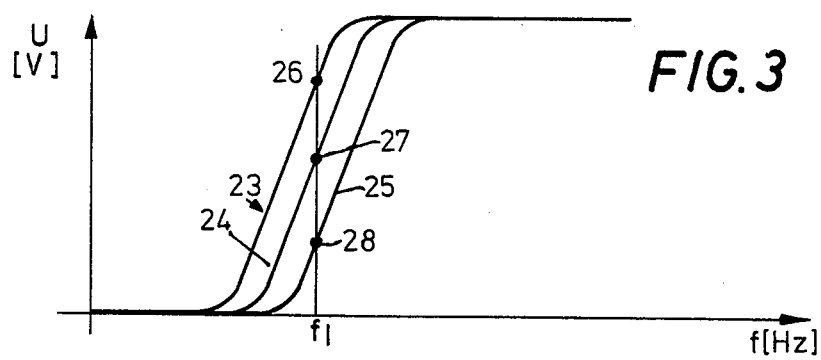
FIG. 3 is a characteristic curve diagram illustrating the operation of the amplifier shown in FIG. 2.

In the illustrated position of switches 7 and 13, the inclusion of capacitors 19 and 21 gives the circuit of FIG. 2 the frequency characteristic shown in FIG. 3. If the circuit initially has the characteristic represented by curve 24, an increase in the value of resistance 20 shifts the frequency characteristic toward lower frequencies, e.g. to the position of characteristic 23. Correspondingly, a reduction of the resistance value of resistor 20 shifts the frequency characteristic toward higher frequencies, i.e. to the position of characteristic 25.

The illustration in FIG. 3 shows that the frequency characteristic of the circuit of FIG. 2 can be shifted exactly parallel to itself without there being a noticeable change in the shape of the characteristic or in the amplitude in the transmission band.

The change in gain in the described circuit, which is intended to simultaneously be effected with a change in the value of resistance 20, is depicted by the intersection of characteristics 23, 24 and 25 with a vertical line placed arbitrarily at a frequency $f_1$.

The points of intersection 26, 27 and 28 with characteristics 23, 24 and 25 indicate that the amplitude of the amplifier output signals for a given input signal amplitude, and thus the gain of amplifier 4, increases with increasing value of resistance 20, corresponding, in order, to points of intersection 28, 27 and 26.

It will be understood that the above description of the present invention is susceptible to various modifications, changes and adaptations, and the same are intended to be comprehended within the meaning and range of equivalents of the appended claims.

What is claimed is:

1. In an amplifier whose transmission factor is to be controlled in response to a control voltage and including means for switching the amplifier between two operating states providing mutually complementary control characteristics, an amplifier member having an inverting input, and an electronically controllable first impedance connected to receive the control voltage and to present an impedance which varies as a function of the control voltage and which determines the amplifier transmission factor, the impedance being connected, in one of the operating states, in a negative feedback path of the amplifier by the switching means, the improvement comprising: means connecting said first impedance to the output of said amplifier member; a second impedance connected to said first impedance to form therewith a series arrangement disposed between the output of said amplifier member and a point at the circuit reference potential of said amplifier; and means defining a direct current path connected to the output of said amplifier member, and wherein said switching means are connected in said amplifier for, in said one operating state, connecting the inverting input of said amplifier member to the point of connection between said first and second impedances and connecting the output of said amplifier member as the output from said amplifier, and the other operating state, connecting said direct current path in series between said amplifier member output and inverting input and connecting the point of connection between said first and second impedances as the output from said amplifier.

2. An arrangement as defined in claim 1 wherein said first impedance comprises a capacitor and an electronically controllable resistor connected together in parallel, and said second impedance comprises a capacitor.

3. An arrangement as defined in claim 2 wherein said amplifier member is a differential amplifier whose noninverting input receives the input signal to said amplifier.

4. An arrangement as defined in claim 1 wherein said amplifier member is a differential amplifier whose noninverting input receives the input signal to said amplifier.

* * * * *